United States Patent
Hsu et al.

(10) Patent No.: US 10,459,584 B2
(45) Date of Patent: Oct. 29, 2019

(54) ELECTRONIC BOOK WITH TOUCH SENSING AND PAGE NUMBER DETECTION

(71) Applicant: AsianLink Technology Incorporation, Taoyuan (TW)

(72) Inventors: Hung-Wang Hsu, Taoyuan (TW); Chun-Hsiang Yang, Taoyuan (TW)

(73) Assignee: AsianLink Technology Incorporation, Taoyuan (TW)

( * ) Notice: Subject to any disclaimer, the term of this patent is extended or adjusted under 35 U.S.C. 154(b) by 0 days.

(21) Appl. No.: 16/028,441

(22) Filed: Jul. 6, 2018

(65) Prior Publication Data

US 2019/0250732 A1 Aug. 15, 2019

(30) Foreign Application Priority Data

Feb. 9, 2018 (TW) .............................. 107104846 A

(51) Int. Cl.
*G06F 3/044* (2006.01)

(52) U.S. Cl.
CPC .................................. *G06F 3/044* (2013.01)

(58) Field of Classification Search
CPC ...................................................... G06F 3/044
See application file for complete search history.

(56) References Cited

U.S. PATENT DOCUMENTS

| 5,810,604 A * | 9/1998 | Kopp, Jr. ............... | G09B 5/062 200/5 A |
| 6,064,855 A * | 5/2000 | Ho ......................... | G09B 5/062 345/901 |
| 7,428,990 B1 * | 9/2008 | Milford .................. | G06K 7/081 235/435 |
| 2003/0116620 A1 * | 6/2003 | Song ..................... | G06F 3/0224 235/375 |
| 2004/0043371 A1 * | 3/2004 | Ernst ....................... | G09B 5/06 434/317 |
| 2004/0219501 A1 * | 11/2004 | Small ...................... | G09B 5/06 434/317 |
| 2012/0089938 A1 * | 4/2012 | Homma ................. | G06F 3/0485 715/776 |
| 2016/0274696 A1 * | 9/2016 | Hsu ......................... | G06F 3/044 |
| 2019/0025963 A1 * | 1/2019 | Obata ..................... | G06F 3/044 |

* cited by examiner

*Primary Examiner* — Premal R Patel
(74) *Attorney, Agent, or Firm* — Lin & Associates Intellectual Property, Inc.

(57) ABSTRACT

The disclosure provides an electronic book with touch sensing and page number detection. The touch sensing is based on capacitive sensing principle, using a plate body, a sheet body, a conductive body, and a processing unit. The board body and the sheet body are similar to dielectric layer. The conductive body carries charges. When an external charged body changes the voltage of the conductive body with the plate and the sheet sandwiched in-between, the processing unit performs appropriate processing, and even plays a sound corresponding to the image or text on the sheet body. The electronic book of the present invention also has a page number detection function. The switches are configured to different combinations by the side shape of the sheet body. The present invention can play different sounds according to different contents on different pages.

9 Claims, 7 Drawing Sheets

ELECTRONIC BOOK WITH TOUCH SENSING AND PAGE NUMBER DETECTION

TECHNICAL FIELD

The technical field generally relates to an electronic book, and in particular, to an electronic book with touch sensing and page number detection.

BACKGROUND

The development of the audio book provides great fun and convenience for young children and visually impaired in reading, in addition to general readers.

Taiwan Patent No. M491889 disclosed "Intelligent Electronic Audio Book" and Taiwan Patent No. I550501 disclosed "Smart Electronic Audio Book Able to Effectively Detect Page Numbers". These two patents were invented by the inventor of the present invention. The above two technologies disclosed the technical means of sensing page numbers and sensing the contents of a page.

First, in page number sensing, the performance of the M491889 is not completely satisfactory because a page number sensor carries a charge amount close to the environmental noise, which causes the capacitive sensor unable to effectively sense the noise or page sensing. To improve the above shortcoming, the invention disclosed in I550501 provides a method for increasing the charge amount of a page number sensor. In addition, the approach of embedding a magnet in a book page is also proposed to achieve a page number detection function to reliably detect the page number accurately. However, as the cost of the Hall IC is high, the more the number of pages, the more the number of Hall ICs must be used and the higher the production cost is.

In addition, to embed a magnet in a book, the magnet must be placed between the two sheets of papers, which can only be done by manually positioning the magnet in place, and then gluing the sheets together, which in turn is very time consuming and labor intensive. Therefore, the type of electronic voice books must be separately produced and would be too costly for general books.

For sensing contents in a page, the main sensing component is a capacitive sensor, such as, ITO sensor, projected capacitive touch Sensor, flexible conductive thin film sensor, or flexible projected capacitive touch sensor. The above capacitive sensors can sense the capacitance changes, but capacitive sensors are expensive, so they are often used on electronic products with high sensitivity requirements. However, on e-books, the production cost cannot be controlled within a reasonable range. Therefore, a special type of sensor must be provided to make touch-sensing technology used in e-books cost-effective, while maintaining effective sensing capabilities.

SUMMARY

The primary object of the present invention is to provide an electronic book with touch sensing function, wherein a high-priced capacitive sensor is not used other than a microprocessor, a voltage sensing chip, and/or a flash memory. For sensing page contents, although based on the same capacitive sensing principle, the difference is that the conventional general high-sensitivity capacitive sensor uses a glass substrate as a dielectric, and then the capacitive sensor is fabricated through a semiconductor process. However, in the present invention, instead of a semiconductor process, a plurality of conductive bodies are directly disposed on an insulating plate body, and the sheet body is also provided with insulation on the plate body, and the plurality of conductive bodies are connected to a power source, so when the finger moves above any of the conductive bodies and is separated with respect to the conductive body by the plate body and the sheet body, the electrical voltage of the conductive body changes due to the capacitive charging and discharging effect. The voltage sensing chip continuously scans and transmits the detection signal to the processing unit to process.

Another object of the present invention is to provide an electronic book with page number detection function. The page number detection function is achieved by using a plurality of switches and a specific structure of the sheet body; that is, the side shape of each sheet body is different, and the sheet body is detachably mounted on the plate body. If the number of switches is two, there are four different switch combinations; similarly, there will be 16 different switch combinations for four switches, so that when the different chip bodies are mounted on the plate body, the switches can be formed into different combinations, and the processing unit determines the page number the switch combination represents.

Yet another object of the present invention is to provide an electronic book with page number detection function, wherein the sheet body may be a blank page, and a user may draw a pattern or put a sticker on the blank page to mark the touch position, and record own voice or sound effect for corresponding page number. By touching the pattern or the sticker, the processing unit plays the voice or sound effect of the corresponding pattern according to the setting.

Yet another object of the present invention is to provide a page detection function able to be used in combination with the technical means of the sensing sheet body of FIG. 1 to FIG. 4. In practical applications, the user first installs a sheet body on the plate body, when the installation of the sheet body is completed, the page number of the aforementioned page number detection means is used to detect the page number of sheet body, and the processing unit generates a setting corresponding to the page number. When the external charged body contacts the images of the sheet body, the speaker generates a corresponding sound according to the aforementioned information content sensing method; if another sheet body is mounted on the plate body, the processing unit generates another setting corresponding to the page number of the other sheet body. When the external charged body touches any information content of the other body, the processing unit controls the speaker to produce a corresponding sound.

In addition to the microprocessor, the voltage sensing chip and/or the flash memory, the present invention uses low cost components, wherein the plate body may be a plastic plate, the conductive body may be a copper foil, the insulation layer between the conductive body and the external charged body is the plate body and the page, and not additional insulation layer needs to be provided. The copper foil and the voltage sensing chip are electrically connected by wires. The aforementioned components are low in cost and can also be easily processed and manufactured to realize an electronic book with a reduced manufacturing cost and good touch sensing function. For detecting the page number, only the sheet body or the page of the book needs to be processed so that the side shape is different. The switch can be an inexpensive dial switch, a button switch, a photoelectric switch, or a mechanism switch with low unit price, and a proper calculation processing, such as, a binary operation, can be used to efficiently detect the page number, thereby achieving a reduction in the cost and a good result for an electronic book with page number detection.

The foregoing will become better understood from a careful reading of a detailed description provided herein below with appropriate reference to the accompanying drawings.

BRIEF DESCRIPTION OF THE DRAWINGS

The embodiments can be understood in more detail by reading the subsequent detailed description in conjunction with the examples and references made to the accompanying drawings, wherein.

DETAILED DESCRIPTION OF THE DISCLOSED EMBODIMENTS

Figure 1:
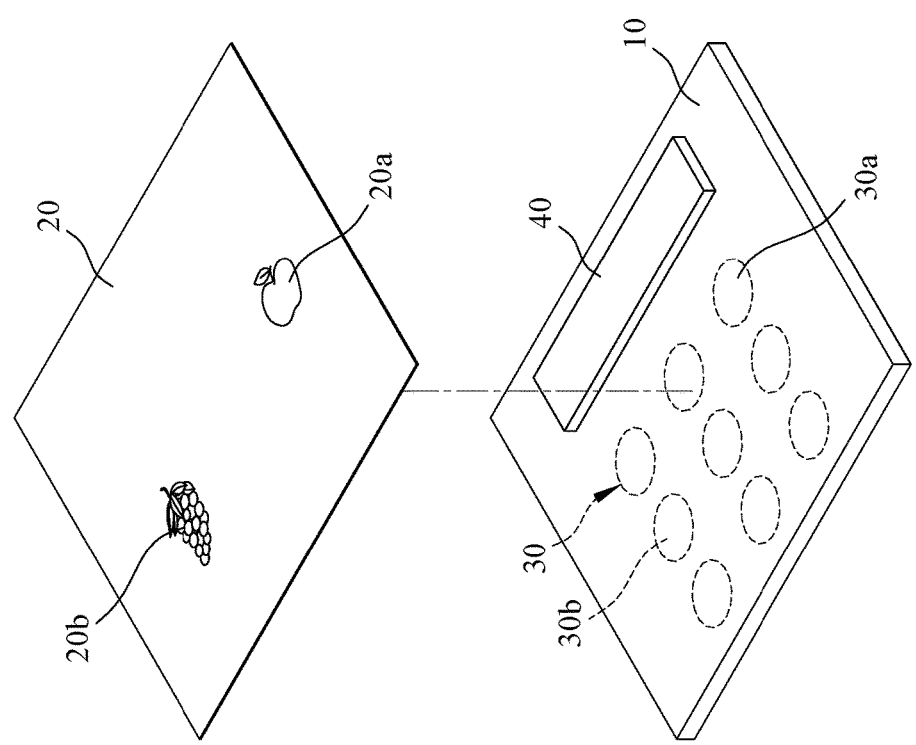
FIG. 1 shows a schematic view of the electronic book with touch sensing in accordance with the first exemplary embodiment of the present invention.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Refer to FIG. 1. FIG. 1 shows a schematic view of the electronic book with touch sensing in accordance with the first exemplary embodiment of the present invention. As shown in FIG. 1, in the first embodiment, the plate body 10 is a plastic plate or other insulating plate body, and the sheet body 20 is in the form of a card or a book page. The sheet body 20 contains an image, such as, an image of an apple 20a and a grape 20b. One or more conductive bodies 30 are disposed on the bottom surface of the plate body 10 (as indicated by dash lines). Preferably, the conductive bodies 30 are thin sheets of conductors, for example, metal sheet, conductive carbon film, or other conductive material. The material of the metal sheet can be copper, gold, silver, aluminum, or other suitable metal materials. In the present embodiment, the conductive bodies 30 comprise 9 copper foils, connected to anode or cathode of a power source (not shown). As such, the positive charge or negative charge can be transmitted to the conductive bodies 30.

The plurality of copper foils 30 is electrically connected to the processing unit 40. The images of the apple 20a and the grape 20b essentially correspond to the copper foil 30a and the copper foil 30b. In principle, the copper foil 30a and the apple image 20a should correspond to each other, and the extent of correspondence does not need to be a complete overlapping, a substantial correspondence will suffice.

In the present embodiment, the conductive body 30 is not limited to the circular shape shown in the figure. Various geometric shapes, such as, quadrangular, polygonal or irregular patterns are also applicable. The arrangement of the conductive bodies 30 of FIG. 1 in a matrix is merely a preferred embodiment for illustrative purpose, and not intended to limit the scope of the present invention, and therefore the present invention is not limited to a regular or irregular arrangement wherein a plurality of conductive bodies 30 are spaced apart from each other by a suitable interval and correspond to different images (or other various information states). The emphasis is that when an external charged body is close to the copper foil corresponding to the image, the electrical voltage of the conductive body corresponding to the image can be changed (see the following for details).

The sheet body 20 also has insulation properties. When the sheet body 20 is placed on the top surface of the plate body 10, the sheet body 20 and the plate body 10 can function as a dielectric layer, so that when an external charged body, such as, a finger or a charged pen tip, comes close to or comes into contact with the sheet body 20, a capacitor-like structure is formed. Since the finger and the copper foil form two electrodes, with an insulating layer (i.e., the sheet body 20 and the board body 10) between two electrodes.

Therefore, when the finger approaches or contacts the image of the apple 20a on the sheet body 20, the voltage of the copper foil 30a corresponding to the apple 20a changes due to the capacitive charging/discharging effect of the copper foil 30a, and the processing unit 40 detects the voltage change, such as, raised to or lowered to a default voltage, and generates a corresponding control signal or sound signal.

In summary, the touching of the information content, such as, the image on the sheet body 20 triggers the processing unit 40 to detect the voltage change of the conductive body 30 corresponding to the image, and then the processing unit 40 generates a control signal or a control command. However, it should be noted that the touch sensing method of the present invention is neither implemented through a capacitive sensor with a transparent sensing electrode, nor is it directly in contact with the sensing electrode, but through a charged copper foil, an external charged body, and the plate body and the sheet body disposed between the charged foil sheet and the external charged body.

The plate body 10 is made of plastic material or any other material with insulating properties. The sheet body 20 can be a card, a book page, a drawing board, and various other forms of sheet bodies. To make the external charged body 100 able to effectively change the voltage of the corresponding conductive body 30, for example, raised or lowered to a default voltage more quickly, the total thickness of the plate body 10 and the sheet body 20 can be in the range of 1-15 mm, and preferably in the range of 1.2-8 mm, and the optimal range of 1.6-2 mm. The external charged body 100 can be a human body part or a charged pen, such as, a finger or a stylus.

Figure 2:
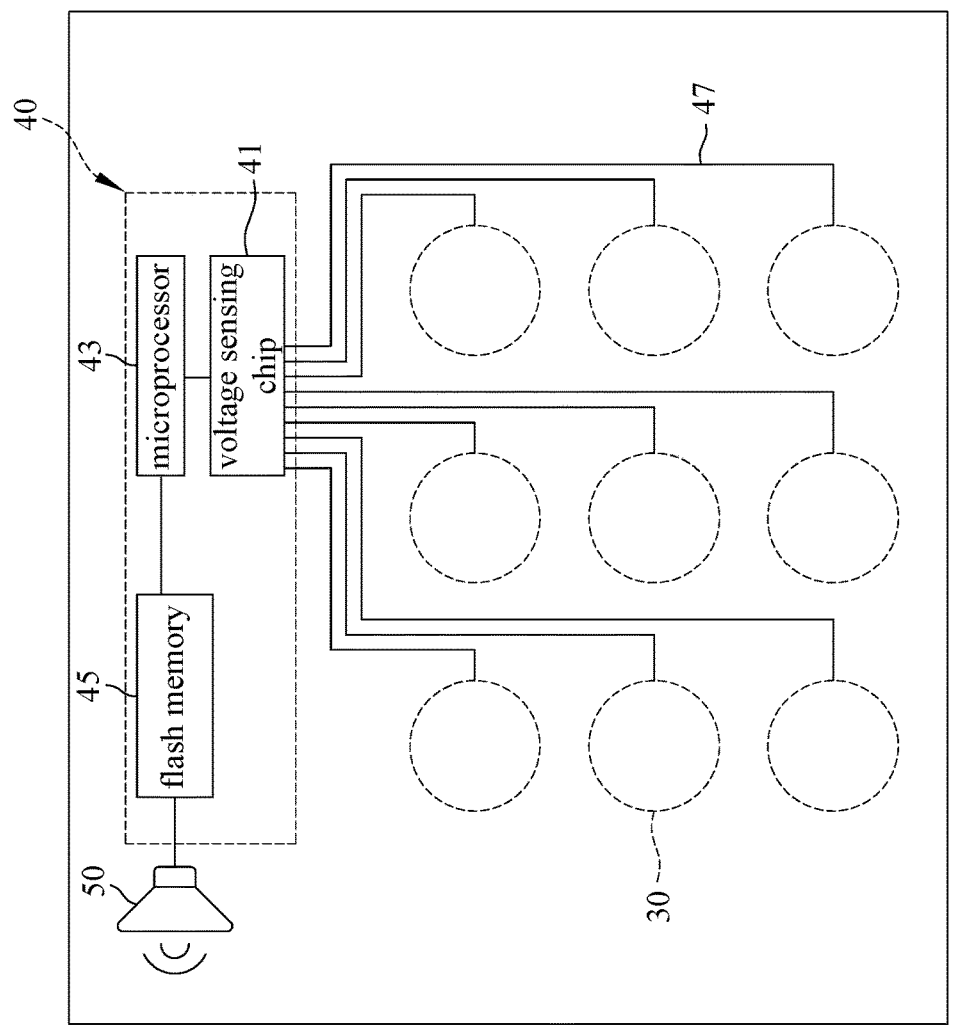
FIG. 2 shows a schematic view of a circuit block diagram in accordance with a preferred exemplary embodiment of the present invention.

Refer to FIG. 2. FIG. 2 shows a schematic view of a circuit block diagram in accordance with an preferred exemplary embodiment of the present invention, wherein the processing unit 40 further comprises a voltage sensing chip 41, and even a flash memory 45. The plurality of conductive bodies 30 is electrically connected to the voltage sensing chip 41, such as, through wires 47. The voltage sensing chip 41 is to sense whether the voltage of the conductive body 30 has changed. When the voltage of the conductive body 30 has changed, the voltage sensing chip 41 generates a sensing signal and transmits to the microprocessor 43 to process. After processing, the microprocessor 43 generates a control signal corresponding to the sensing signal and transmits to the flash memory 45.

The flash memory 45 receives the control signal and generates a sound signal corresponding to the control signal to be played by the speaker 50. The flash memory 45 is pre-stored with a plurality of sound messages, and the settings for the flash memory 45 and the microprocessor 43 are configured in advance. Therefore, the microprocessor 43 can generate a different control signal corresponding to a different sensing signal, and the flash memory 45 can generate a different sound signal corresponding to a different control signal. In the present embodiment, the flash memory 45 at least stores two sound signals, corresponding to the images of apple 20a and grape 20b respectively, such as, the sound of "apple" and "grape". The aforementioned voltage sensing chip 41 can be a touch control chip.

Figure 3:
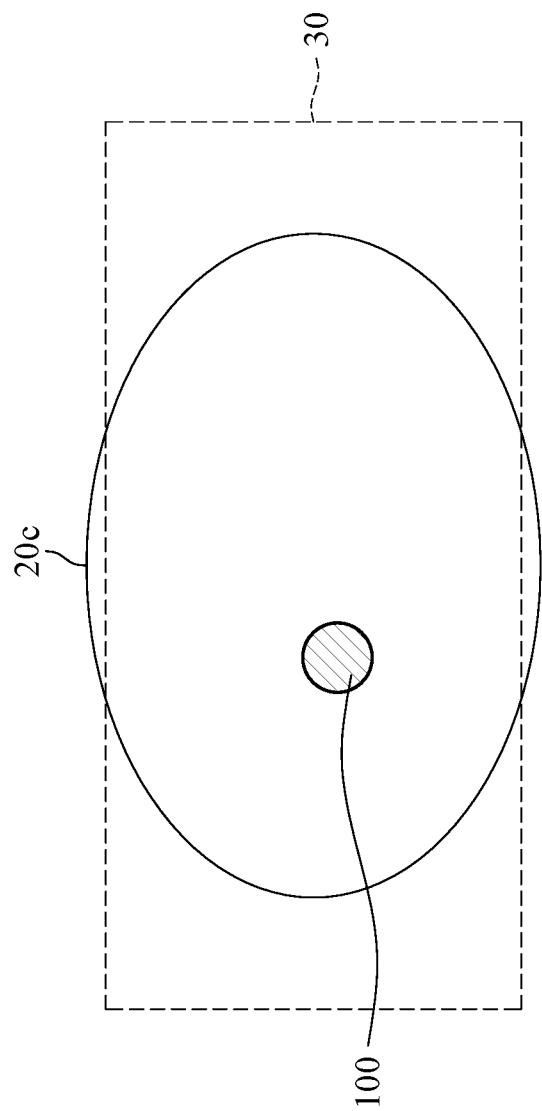
FIG. 3 shows a schematic view of the first disposition relation between the image of the sheet body and the conductive body in accordance with the exemplary embodiment of the present invention.

Refer to FIG. 3. FIG. 3 shows a schematic view of the first disposition relation between the image of the sheet body and the conductive body in accordance with the exemplary embodiment of the present invention. The small circles in FIG. 3 indicates the area of the external charged body 100 contacting the sheet body 20, and the large circle indicates the profile outline 20c of the image (i.e., information contents) on the sheet body. When the external charged body 100 contacts the image 20c, the position of the external charged body 100 also corresponds to the conductive body 30 underneath the image, wherein the external charged body 100 is within the range able to cause the conductive body 30 to change voltage. As such, the voltage of the conductive body 30 changes, and the voltage sensing chip 41 transmits the sensing signal indicating the conductive body to the microprocessor. The microprocessor generates a corresponding control signal to control the speaker after determination. Therefore, when a plurality of conductive bodies corresponding to a plurality of information contents, the microprocessor can generates different control signals according to sensing signals from different conductive bodies to control the speaker to play different audio, sound, or music signals. Hence, the electronic books of the present invention can provide speeches.

Figure 4:
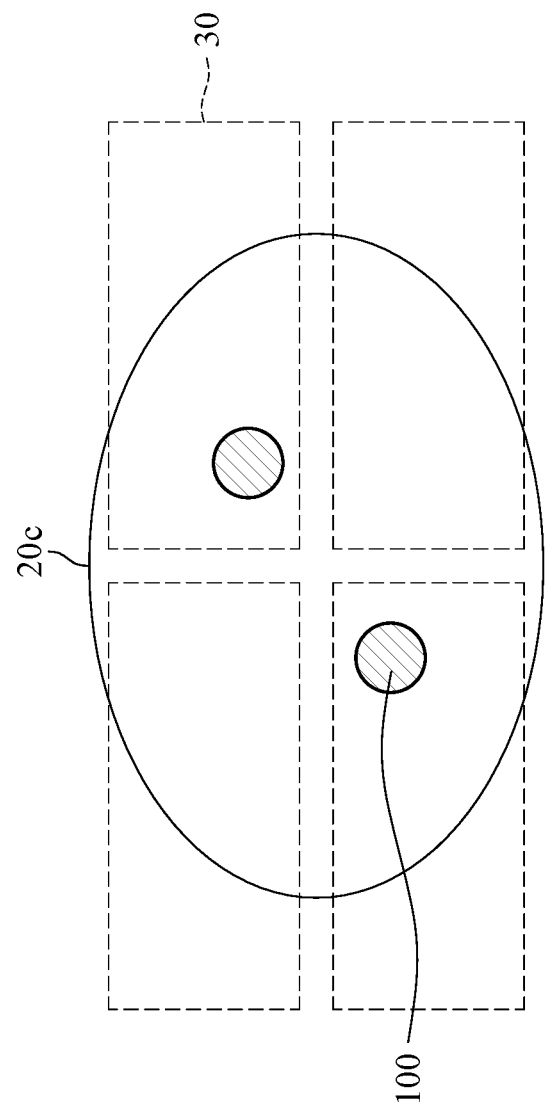
FIG. 4 shows a schematic view of the second disposition relation between the image of the sheet body and the conductive body in accordance with the exemplary embodiment of the present invention.

Refer to FIG. 4. FIG. 4 shows a schematic view of the second disposition relation between the image of the sheet body and the conductive body in accordance with the exemplary embodiment of the present invention. If the image 20c has a larger area, the image 20c may correspond to a plurality of conductive bodies 30. As shown in FIG. 4, four conductive bodies 30 correspond to the image 20c. Although when the external charged body 100 can contact four different conductive bodies and the voltage sensing chip 41 can sense voltage change in four different conductive bodies, the microprocessor can generate the same control signal for the four conductive bodies to control the speaker to play the same sound signal if the appropriate settings are configured in advance. In other words, regardless the external charged body 100 contacts the conductive body at the upper right corner or the lower left corner, the microprocessor will generate the same control signal to control the speaker to play the same sound signal.

Figure 5:
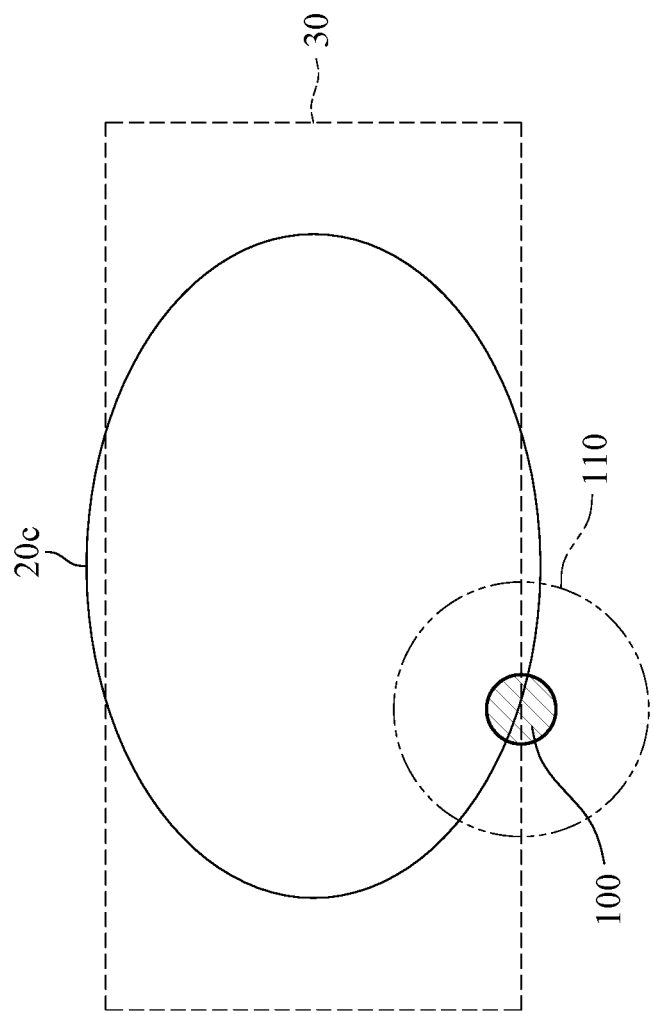
FIG. 5 shows a schematic view of the capacitance sensing range caused by finger touching with the finger as the external charged body in accordance with the exemplary embodiment of the present invention.

Refer to FIG. 5. FIG. 5 shows a schematic view of the capacitance sensing range caused by finger touching with the finger as the external charged body in accordance with the exemplary embodiment of the present invention. In the present invention, if a finger is used as an externally charged body, the capacitive sensing area of the conductive body may be slightly larger than the portion touched by the finger. Since the finger is electrostatically charged on the skin, a capacitive sensing can also occur even if the finger is not in contact with the image but only within the distance able to cause voltage change in the conductive body. That is, the dash circle indicated in FIG. 5 showing the distant sensing area 110, i.e., the capacitive sensing area caused not by the finger touching the sheet body. Therefore, when the finger is in contact with the sheet body, the finger not only causes capacitive sensing at the contact position of the sheet body, but also causes distant capacitive sensing in the surrounding area of the contact position on the sheet body. Based on this characteristic, when the finger does not contact the image 20c, but very close to the edge of the image 20c or at the edge of the image 20c, the finger can also change the voltage of the conductive body corresponding to the image, so that the microprocessor must intervene to process. Compared to the prior art wherein only the direct contact can trigger specific effects, the present invention is effective as long as the finger points to the edge of the image or is very close to the edge of the image to trigger the sensing and subsequent processing.

Figure 6:
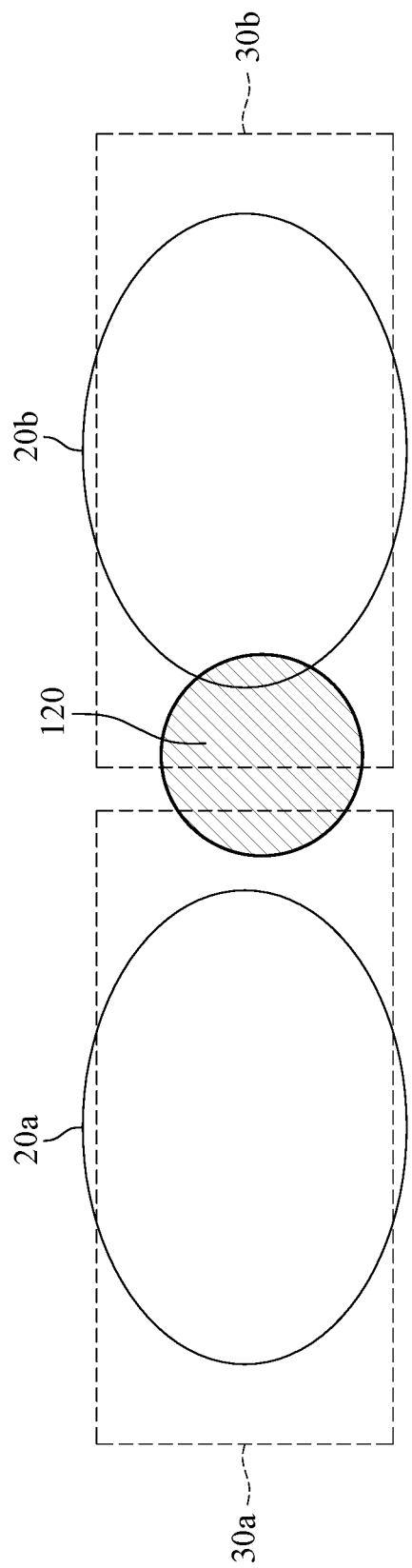
FIG. 6 shows a schematic view of the external charge body corresponding simultaneously to two conductive bodies in accordance with the exemplary embodiment of the present invention.

Refer to FIG. 6. FIG. 6 shows a schematic view of the external charge body corresponding simultaneously to two conductive bodies in accordance with the exemplary embodiment of the present invention. The interval between the aforementioned adjacent conductive bodies is equal to or slightly larger than the width of the finger, so in the above example, the fingers will not simultaneously cause the voltage change in two conductive bodies. On the other hand, FIG. 6 shows the scenario wherein the distance between the conductive bodies is smaller than the finger width. For example, when the image 20b of the grape is touched by the finger 120 (the circle indicates the area wherein the finger is in contact with the sheet body), the finger 120 will correspond to the copper foil 30b as well as the copper foil 30a underneath the apple image 20a. As shown clearly in FIG. 6, the area of the apple image 20a corresponding to the finger 120 is significantly smaller than the area of the grape pattern 20b corresponding to the finger 120. Because the capacitance is proportional to the area of the electrode, the voltage change in the copper foil 30a corresponding to the apple image 20a must be smaller and slower with respect to the voltage change in the copper foil 30b corresponding to the grape image 20b. Therefore, the microprocessor 43 will first sense the voltage change of the copper foil 30b without processing the subsequently received sensing signal, and the speaker 50 is controlled to play the sound signal corresponding to the grape. If the finger 120 exactly corresponds to two copper foils at the same time, and the touch produces almost the same effect and causes almost the same voltage change and the microprocessor almost simultaneously sense the voltage change, the microprocessor can also be configured in advance not to generate any control signal in such a scenario, or generate a default control signal to control the speaker to play suitable message, such as, "please touch again" or "please touch the correct position", or play a specific sound effect as a warning.

As such, when two or more conductive bodies show voltage change, the voltage sensing chip 41 can effectively sense the voltage change as long as one of the conductive bodies shows significantly higher or faster change rate of voltage change. Therefore, the microprocessor can process and play the corresponding sound signal of the sensed conductive body. Conversely, when the change rates or change amounts of voltage of the adjacent conductive bodies are almost the same or close, the microprocessor can either choose to ignore the situation or process based on a default setting, such as, playing "touch again", depending on the configuration in advance.

In other words, the microprocessor can configure the settings according to different distances of the conductive bodies. The aforementioned examples of microprocessors with various settings and played sound signals are only examples for illustration, and are not intended to limit the scope of the present invention. Any applications using the above structure and electronic components to detect the voltage change of the conductive bodies and to trigger the microprocessor to perform the corresponding processing all fall within the scope of the present invention.

The aforementioned embodiment has one or more pieces of information contents already on the sheet body. Although the images of apple and grape are of the image-type content, other types of contents can also be played, such as text. Moreover, a black card or book page can also be used to allow the user to compose own information contents, such as, images, texts, or stickers; and then record corresponding sound signals to be played associated with the above information contents. Then, by touching or other means to cause the capacitive reaction of the corresponding conductive body, the microprocessor can memorize, i.e., configure, the correspondence between the conductive body and recorded sound signals. Therefore, when the user completes the configuration, the corresponding sound signal is played when the user touches the information contents composed by the user.

To achieve the above objects, the present invention provides a method of using the recording button (not shown) in combination with the flash memory 45 of the processing unit 40. When the recording button is pressed and the voltage of one or more conductive bodies changes, the flash memory 45 starts to perform a recording function to record a voice message spoken by the user. At the same time, the voltage sensing chip 41 generates a voltage detection signal, and the microprocessor 43 defines a control signal corresponding to the voltage detection signal. The flash memory also defines a correspondence between the control signal and the voice message spoken by the user. The flash memory 45 may be a detachable memory card.

Another method is to use a microprocessor with recording and playing functions in combination with the recording button, instead of using the flash memory. When the recording button is pressed and the voltage of one or more conductive bodies changes, the microprocessor starts to perform a recording function to record a voice message spoken by the user. At the same time, the voltage sensing chip 41 generates a voltage detection signal, and the microprocessor 43 defines a control signal corresponding to the voltage detection signal and defines a correspondence between the control signal and the voice message spoken by the user. The flash memory or the microprocessor with recording and playing functions can be initialized to clean the stored data, or writes over the stored data when executing the recording function.

Figure 7:
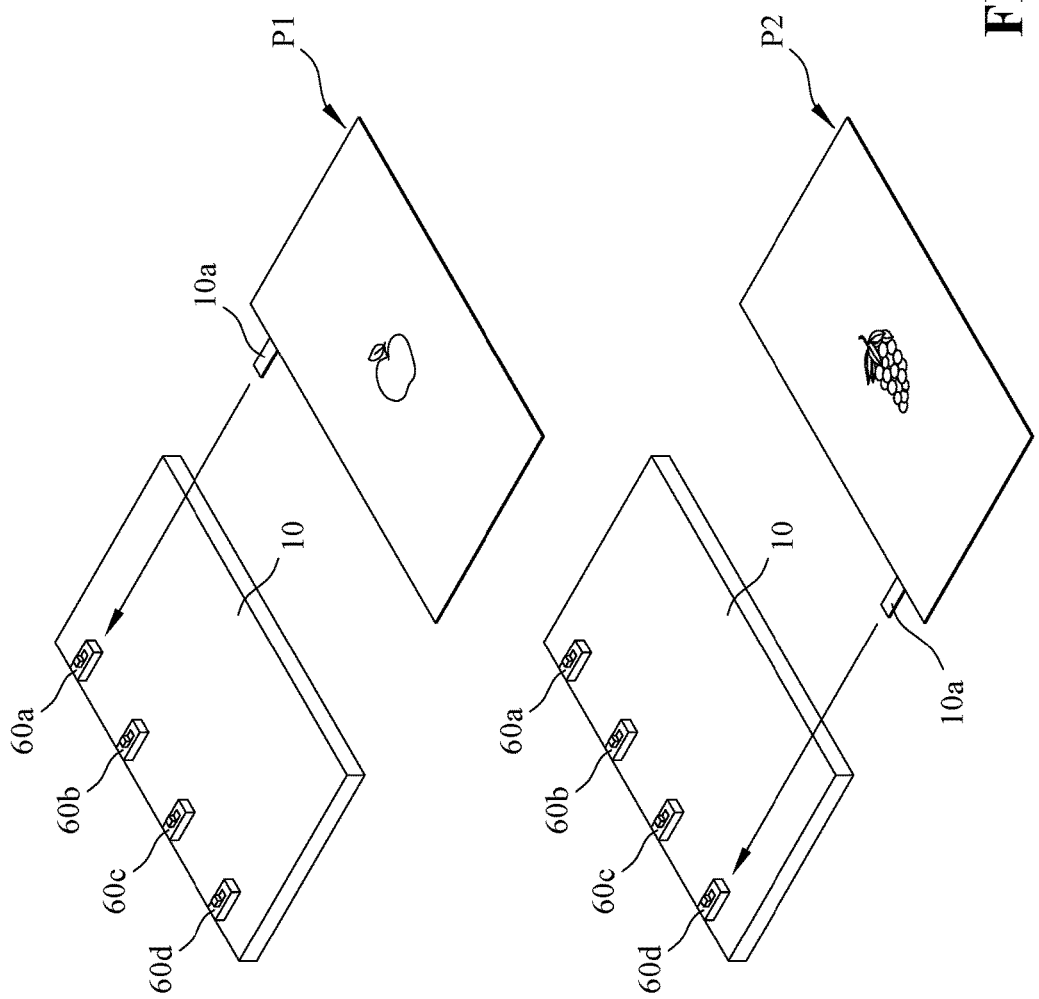
FIG. 7 shows a schematic view of the first disposition of the side structure of the sheet body and the switch in accordance with the exemplary embodiment of the present invention.

FIG. 7 shows a schematic view of the first disposition of the side structure of the sheet body and the switch in accordance with the exemplary embodiment of the present invention. As shown in FIG. 7, four switches 60a-60d are used. Since each sheet body has a front side and a back side, a 6-page electronic book will have 12 pages. Preferably, the four switches 60a-60d are disposed with intervals on the same side of the sheet body 10. Of course, the switches can also be set on different sides, depending on the actual needs. The switch is not limited to any specific form, either electronic component or mechanical switch. In the present embodiment, the switch is a toggle switch. The side structure of the sheet body 10 mainly is disposed with a different number of convex portions on the side, corresponding to the positions of the switches.

Therefore, the four switches can be viewed as four bits. When a switch is triggered, the switch is considered by the microprocessor as at a high voltage, and an untriggered switch is viewed as at a low voltage. Through the computation of the microprocessor, the page number of the sheet body mounted on the insulated body can be determined, i.e., whether the mounted sheet body is showing the front side or the back side. For example, a convex portion 10a is disposed at a side of the sheet body 10 and the convex portion 10a corresponds to the topmost switch. When the sheet body 10 is disposed on the plate body showing the front side upwards, the convex portion 10a will only touch the topmost switch. When the same sheet body 10 is disposed on the plate body showing the back side upwards, the convex portion 10a will only touch the bottom most switch. Therefore, two symmetrical sets of page numbers 1000 and 0001 will be generated, wherein "1" indicates high voltage and "0" indicates low voltage. Hence, with microprocessor configuring in advance, the microprocessor can determines the current page number, such as, page P1 and page P2, according to 1000 and 0001.

As such, different sheet body can be disposed with different number of convex portions or concave portions. When the sheet body is mounted on the plate body, the switches will generate a 4-bit digital signal according to the actual trigger. It should be noted that the number of switches and the actual page number depend on the application. The above example is for illustrative purpose, instead of restrictive purpose. More switches can be used for book with more pages, and with microprocessor configuring in advance, the microprocessor can determine current page number and output control signal related to the current page number.

Accordingly, the page number detection function of the present invention can be used in combination with the technical means for sensing the contents on the sheet body in FIG. 1 to FIG. 6. In practical applications, the user first mounts a sheet body on a plate body. The aforementioned page number detection method is used to determine the page number of the sheet body, and the microprocessor generates a setting corresponding to the page number. Therefore, when the external charged body contacts the image on the sheet body, the aforementioned information content sensing method is used to control the speaker to play a corresponding sound signal. When another sheet body is mounted on the plate body, the microprocessor generates a setting corresponding to the page number of the other sheet body so that the speaker plays a corresponding sound signal.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An electronic book with touch sensing function, comprising:
    a plate body, with insulating property;
    a plurality of sheet bodies, detachably mounted on the plate body;
    a plurality of conductive bodies, fixed to the plate body and having a suitable distance with the sheet bodies; and
    a processing unit, disposed on the plate body and electrically connected to the plurality of conductive bodies;
    a page number detection unit, comprising: a plurality of switches and a microprocessor, the plurality of switches being electrically connected to the microprocessor;
    wherein, when an external charged body touching or at a suitable close vicinity of any conductive body through the separation of the plate body and sheet body to cause voltage change in the conductive body due to capacitive sensing reaction, the processing unit sensing the voltage change and processing according to the voltage change;
    wherein the plurality of sheet bodies having different side structures, when mounted onto the plate body, the different side structure causing the plurality of switches to generate a different combination of switch states, and the microprocessor determining a page number of a current sheet body according to the different combination of switch states.

2. The electronic book with touch sensing function as claimed in claim 1, wherein the sheet body is a card, a book page, or a sketch pad.

3. The electronic book with touch sensing function as claimed in claim 1, wherein the sheet body having a surface displays one or more information contents, each of the information contents roughly correspond to any of the plurality of the conductive bodies.

4. The electronic book with touch sensing function as claimed in claim 1, wherein the conductive bodies are made of metal sheets or conductive carbon film, the external charged body is a human body or a pen with charged tip, and the metal sheet is at least one of copper, gold, silver or aluminum.

5. The electronic book with touch sensing function as claimed in claim 1, the processing unit comprises a microprocessor and a voltage sensing chip, the voltage sensing chip is electrically connected between the conductive bodies and the microprocessor; the voltage sensing chip detects whether the voltage change in the conductive body occurs and the microprocessor processes according to a signal transmitted by the voltage sensing chip.

6. The electronic book with touch sensing function as claimed in claim 5, wherein the processing unit further comprises a flash memory, electrically connected to the microprocessor, for generating a sound signal according to a signal transmitted from the microprocessor, and the sound signal is played by a speaker.

7. The electronic book with touch sensing function as claimed in claim 5, wherein the processing unit further comprises a flash memory and a recording button; when the recording button is pressed and one or more conductive bodies change voltage, the flash memory starts to record a voice message, the voltage sensing chip generates a voltage detection signal, and the microprocessor defines a control signal, correspondence between the control signal and the voltage detection signal, and correspondence between the voice message and the control signal.

8. The electronic book with touch sensing function as claimed in claim 1, wherein the side structure comprises one or more convex portions and/or concave portions.

9. The electronic book with touch sensing function as claimed in claim 8, wherein the switch is an electronic switch, a photoelectrical switch or a mechanical switch.

* * * * *